US012575414B2

(12) United States Patent
Chang

(10) Patent No.: US 12,575,414 B2
(45) Date of Patent: Mar. 10, 2026

(54) SEMICONDUCTOR STRUCTURE HAVING DEEP TRENCH CAPACITOR AND METHOD OF MANUFACTURING THEREOF

(71) Applicant: TAIWAN SEMICONDUCTOR MANUFACTURING COMPANY LTD., Hsinchu (TW)

(72) Inventor: Jen-Yuan Chang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 659 days.

(21) Appl. No.: 17/817,108

(22) Filed: Aug. 3, 2022

(65) Prior Publication Data

US 2024/0047383 A1 Feb. 8, 2024

(51) Int. Cl.
| *H01L 23/58* | (2006.01) |
| *H01L 23/00* | (2006.01) |
| *H10D 1/00* | (2025.01) |
| *H10D 1/68* | (2025.01) |

(52) U.S. Cl.
CPC .......... *H01L 23/585* (2013.01); *H01L 23/562* (2013.01); *H01L 23/564* (2013.01); *H10D 1/042* (2025.01); *H10D 1/716* (2025.01)

(58) Field of Classification Search
CPC ... H01L 23/585; H01L 23/562; H01L 23/564; H01L 23/3171; H01L 23/3192; H10D 1/042; H10D 1/716
See application file for complete search history.

(56) References Cited

U.S. PATENT DOCUMENTS

| 2011/0266603 A1* | 11/2011 | Nakamura | H10D 1/716 |
| | | | 257/532 |
| 2012/0061798 A1* | 3/2012 | Wong | H10D 1/665 |
| | | | 257/532 |
| 2012/0153436 A1* | 6/2012 | Hasunuma | H10D 1/716 |
| | | | 257/532 |
| 2020/0176552 A1* | 6/2020 | Chang | H10D 1/665 |
| 2021/0005393 A1* | 1/2021 | Lu | H10D 1/716 |
| 2022/0059647 A1* | 2/2022 | Zhang | H10D 62/102 |
| 2023/0084798 A1* | 3/2023 | Li | H10D 1/716 |
| | | | 257/534 |

* cited by examiner

*Primary Examiner* — Omar F Mojaddedi
(74) *Attorney, Agent, or Firm* — WPAT LAW; Anthony King

(57) ABSTRACT
The semiconductor structure includes a substrate defined with an array region and a seal ring region surrounding the array region, and including a recess extending into the substrate; a capacitor cell disposed within the array region; and a seal ring disposed within the seal ring region, and including a capacitor structure at least partially disposed within the recess, and an interconnect structure disposed over the capacitor structure, wherein the interconnect structure is electrically coupled to the substrate.

20 Claims, 15 Drawing Sheets

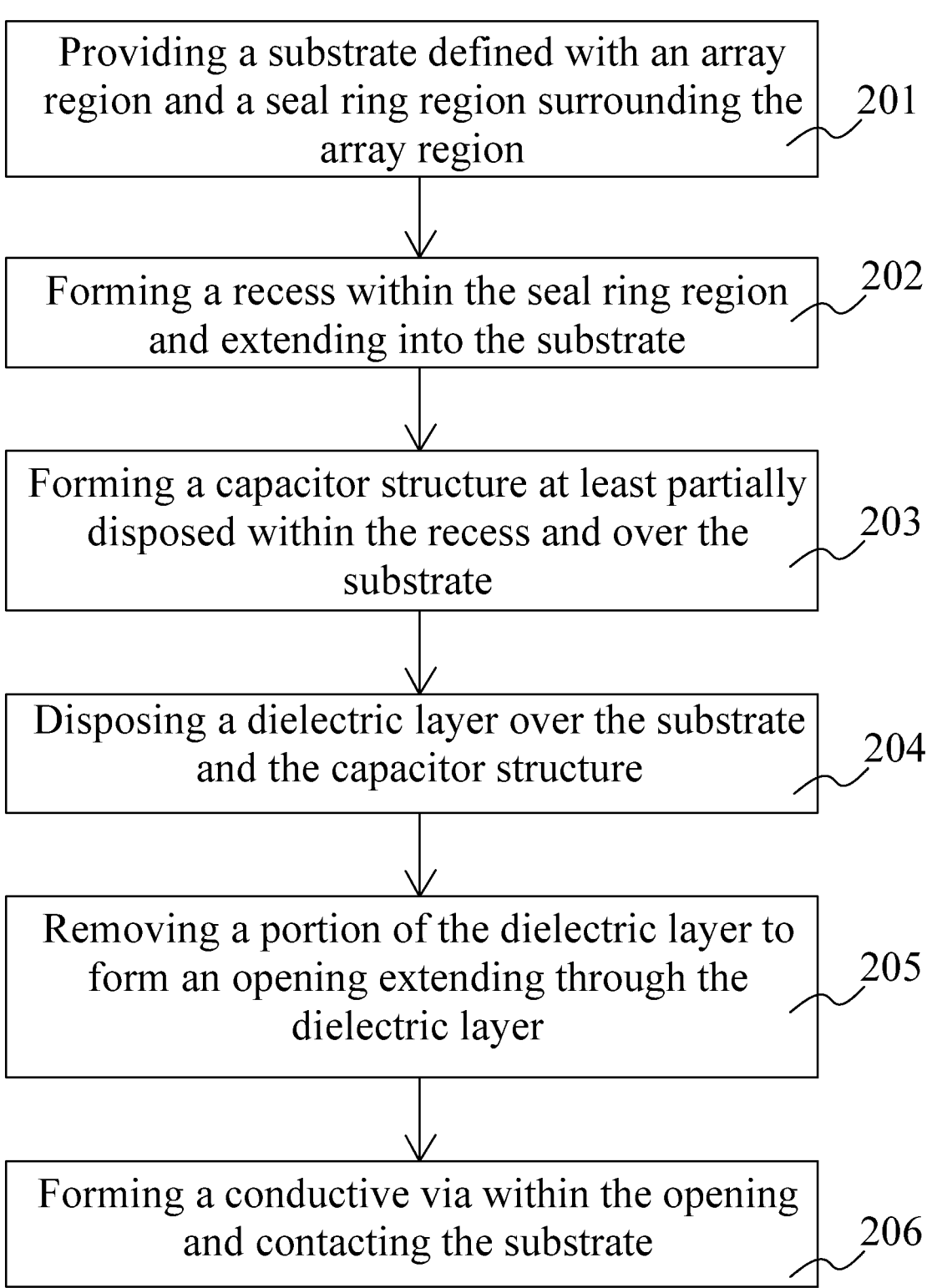

200

Providing a substrate defined with an array region and a seal ring region surrounding the array region — 201

Forming a recess within the seal ring region and extending into the substrate — 202

Forming a capacitor structure at least partially disposed within the recess and over the substrate — 203

Disposing a dielectric layer over the substrate and the capacitor structure — 204

Removing a portion of the dielectric layer to form an opening extending through the dielectric layer — 205

Forming a conductive via within the opening and contacting the substrate — 206

FIG. 8

SEMICONDUCTOR STRUCTURE HAVING DEEP TRENCH CAPACITOR AND METHOD OF MANUFACTURING THEREOF

BACKGROUND

The semiconductor industry has experienced rapid growth due to ongoing improvements in the integration density of a variety of electrical components. To accommodate the miniaturized scale of the semiconductor device, various technologies and applications have been developed for the wafer-level packaging, involving greater numbers of different components with different functions. Improvement in integration density has resulted from iterative reduction of minimum feature size, which allows more components to be integrated into a given area.

As semiconductor technologies further advance, embedding electrical components into a semiconductive substrate have emerged as an effective alternative to further reduce the physical size of a semiconductor device. The electrical component is at least partially embedded within the semiconductive substrate in order to minimize occupying a space above the semiconductive substrate. Such embedment processes utilize sophisticated techniques, and improvements are desired.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 8 is a flow diagram of a method of manufacturing a semiconductor structure in accordance with some embodiments of the present disclosure.

DETAILED DESCRIPTION

Figure 1:
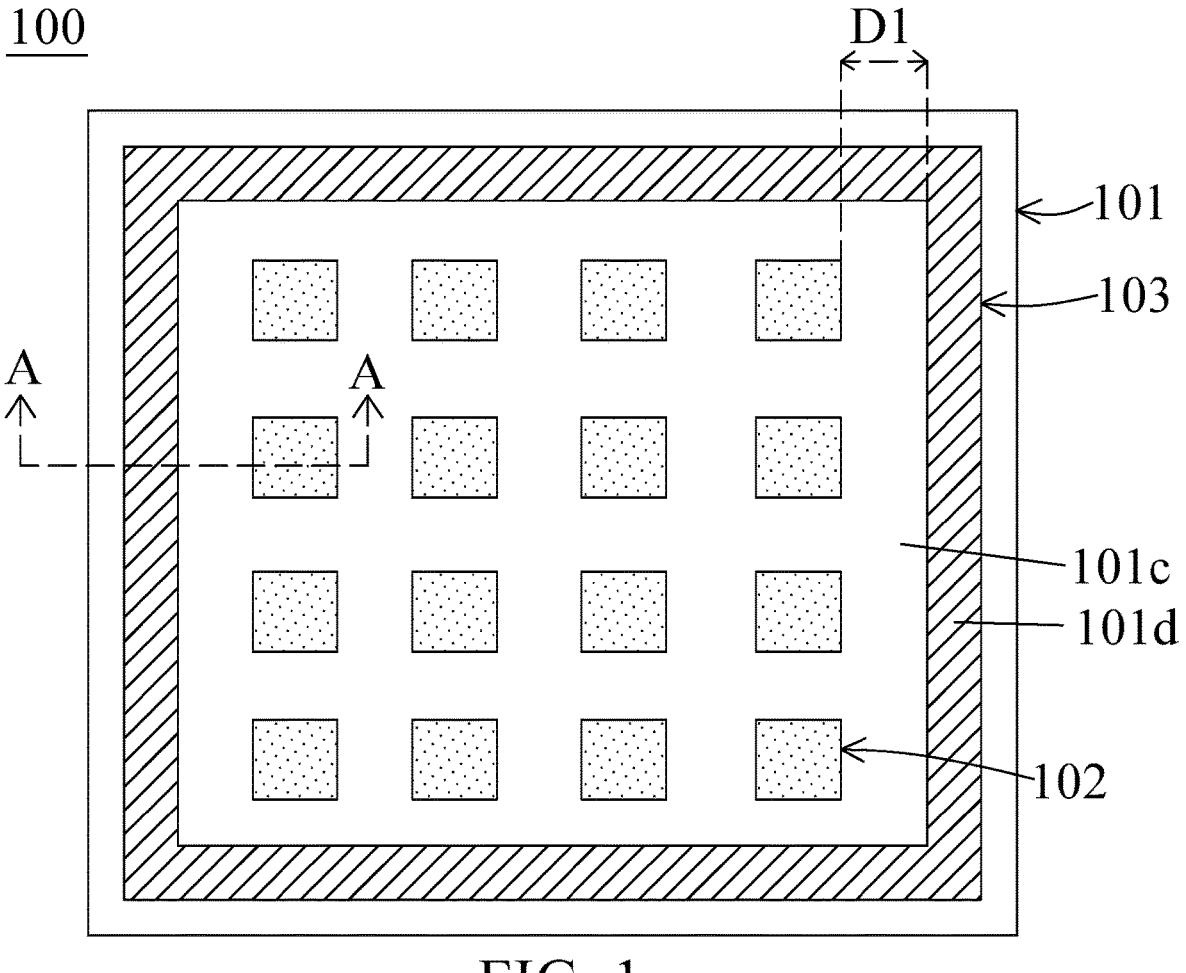
FIG. 1 is a cross-sectional top view of a semiconductor structure in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies.

Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

In the present disclosure, a semiconductor structure and a method of manufacturing a semiconductor structure are provided. The semiconductor structure includes a substrate defined with an array region and a seal ring region surrounding the array region, and including a recess extending into the substrate; a capacitor cell disposed within the array region; and a seal ring disposed within the seal ring region, and including a capacitor structure at least partially disposed within the recess, and an interconnect structure disposed over the capacitor structure, wherein the interconnect structure is electrically coupled to the substrate. Other features and processes may also be included.

In some embodiments, the method of manufacturing the semiconductor structure includes providing a substrate defined with an array region and a seal ring region surrounding the array region; forming a recess within the seal ring region and extending into the substrate; forming a capacitor structure at least partially disposed within the recess and over the substrate; disposing a dielectric layer over the substrate and the capacitor structure; removing a portion of the dielectric layer to form an opening extending through the dielectric layer; forming a conductive via within the opening and contacting the substrate. As a result, development of cracks can be minimized or prevented by the seal ring. The overall strength of the semiconductor structure can be increased or improved.

Figure 2:
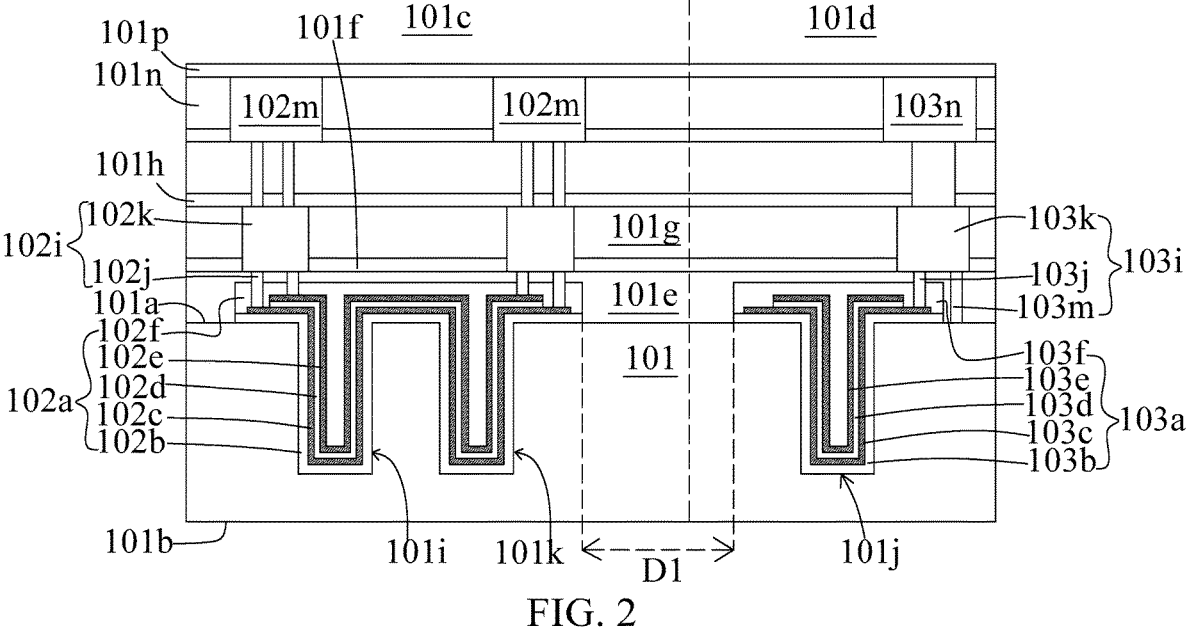
FIG. 2 is a cross-sectional view of the semiconductor structure along a line A-A of FIG. 1.

FIG. 1 is a schematic cross-sectional top view of a semiconductor structure 100 in accordance with some embodiments of the present disclosure. FIG. 2 is a schematic cross-sectional view of the semiconductor structure 100 along a line A-A of FIG. 1. In some embodiments, the semiconductor structure 100 includes a substrate 101, several capacitor cells 102, and a seal ring 103 surrounding the capacitor cells 102. In some embodiments, a distance between the capacitor cell 102 and the seal ring 103 is substantially greater than 0.1 um.

Referring to FIG. 1, the semiconductor structure 100 is a chip, a package or a part of the chip or the package. In some embodiments, the semiconductor structure 100 is a part of a system on integrated circuit (SoIC) structure, a chip on wafer on substrate (CoWoS) structure, integrated fan out (InFO) structure or the like.

In some embodiments, the substrate 101 includes semiconductive material such as silicon, germanium, gallium, arsenic, or a combination thereof. In some embodiments, the substrate 101 is a semiconductor wafer. In some embodiments, the substrate 101 is a silicon substrate. Referring to FIG. 2, the substrate 101 includes a first surface 101a and a second surface 101b opposite to the first surface 101a. In some embodiments, the first surface 101a is a front side or an active side that several electrical components are disposed thereon. In some embodiments, the second surface 101b is a back side or an inactive side that electrical component disposed thereon is absent.

Referring to FIGS. 1 and 2, the substrate 101 defines with an array region 101c and a seal ring region 101d surrounding the array region 101c. The array region 101c is a region where the capacitor cells 102 arranged. In some embodiments, the array region 101c is a central region of the substrate 101 and has an area substantially greater than the seal ring region 101d. The capacitor cells 102 are arranged in rows and columns within the array region 101c.

The seal ring region 101d surrounds all of the capacitor cells 102. In some embodiments, the seal ring region 101d is in a frame shape from the top view of the semiconductor structure 100. The seal ring 103 is disposed within the seal ring region 101d. In some embodiments, the seal ring region 101d is disposed proximal to a periphery of the semiconductor structure 100, while the array region 101c is disposed distal to the periphery of the semiconductor structure 100.

The substrate 101 includes a first recess 101i and a second recess 101j respectively extending into the substrate 101. In some embodiments, the first recess 101i and the second recess 101j respectively extend from the first surface 101a towards the second surface 101b of the substrate 101. The first recess 101i is disposed within the array region 101c, and the second recess 101j is disposed within the seal ring region 101d. In some embodiments, a width of the first recess 101i is substantially equal to a width of the second recess 101j. In some embodiments, a depth of the first recess 101i is substantially equal to a depth of the second recess 101j.

In some embodiments, the substrate 101 further includes a third recess 101k extending into the substrate 101. In some embodiments, the third recess 101k extends from the first surface 101a towards the second surface 101b of the substrate 101. The third recess 101k is disposed within the array region 101c. The third recess 101k is disposed adjacent to the first recess 101i. In some embodiments, a width of the first recess 101i is substantially equal to a width of the third recess 101k. In some embodiments, a depth of the first recess 101i is substantially equal to a depth of the third recess 101k.

The capacitor cells 102 are disposed within the array region 101c. In some embodiments, each of the capacitor cell 102 includes a first capacitor structure 102a and a first interconnect structure 102i disposed above the first capacitor structure 102a. The first capacitor structure 102a is at least partially disposed within the first recess 101i. In some embodiments, the first capacitor structure 102a is at least partially disposed within the first recess 101i and the third recess 101k. In some embodiments, the first capacitor structure 102a is configured to add capacitance for a circuitry in the substrate 101.

The first capacitor structure 102a includes a first isolation layer 102b, a first electrode 102c, a first capacitor dielectric 102d, a second electrode 102e, and a second isolation layer 102f. In some embodiments, the first capacitor structure 102a includes several first electrodes, several first capacitor dielectrics, and several second electrodes alternately disposed. In some embodiments, and several first electrodes, several first capacitor dielectrics and several second electrodes are sequentially stacked between the first isolation layer 102b and the second isolation layer 102f.

In some embodiments, the first isolation layer 102b is disposed over the first surface 101a of the substrate 101 and conformal to the first recess 101i. In some embodiments, the first isolation layer 102b is also disposed conformal to the third recess 101k. The first isolation layer 102b includes dielectric material such as oxide or the like. In some embodiments, the first isolation layer 102b includes silicon dioxide or the like. In some embodiments, the first isolation layer 102b includes high-k (high dielectric constant) dielectric material, such as hafnium aluminate oxide (HfAlO), zirconium oxide ($ZrO_2$), aluminum oxide, titanium oxide, etc.

The first electrode 102c is disposed over and conformal to the first isolation layer 102b. The first electrode 102c is disposed over the first surface 101a of the substrate 101 and is at least partially disposed within the first recess 101i. In some embodiments, the first electrode 102c is also at least partially disposed within the third recess 101k. The first electrode 102c includes conductive material such as copper, titanium nitride (TiN), polysilicon or the like. In some embodiments, a portion of the first isolation layer 102b is exposed through the first electrode 102c. In some embodiments, the first electrode 102c is a bottom electrode of the first capacitor structure 102a.

The first capacitor dielectric 102d is disposed over and conformal to the first electrode 102c. The first capacitor dielectric 102d is disposed over the first surface 101a of the substrate 101 and is at least partially disposed within the first recess 101*i*. In some embodiments, the first capacitor dielectric 102*d* is also at least partially disposed within the third recess 101*k*. The first capacitor dielectric 102*d* includes dielectric material such as nitride, oxide or the like. In some embodiments, the first capacitor dielectric 102*d* includes high-dielectric material, such as HfAlO, ZrO$_2$, aluminum oxide, titanium oxide, etc. In some embodiments, a portion of the first electrode 102*c* is exposed through the first capacitor dielectric 102*d*.

The second electrode 102*e* is disposed over and conformal to the first capacitor dielectric 102*d*. The second electrode 102*e* is disposed over the first surface 101*a* of the substrate 101 and is at least partially disposed within the first recess 101*i*. In some embodiments, the second electrode 102*e* is also at least partially disposed within the third recess 101*k*. The second electrode 102*e* includes conductive material such as copper, titanium nitride (TiN), polysilicon or the like. In some embodiments, the first capacitor dielectric 102*d* is entirely covered by the second electrode 102*e*. In some embodiments, a portion of the first isolation layer 102*b* and a portion of the first electrode 102*c* are exposed through the second electrode 102*e*. In some embodiments, a portion of the first isolation layer 102*b* and a portion of the first electrode 102*c* are exposed through the first capacitor dielectric 102*d*. In some embodiments, the second electrode 102*e* is a top electrode of the first capacitor structure 102*a*.

The second isolation layer 102*f* is disposed over the first isolation layer 102*b*, the first electrode 102*c*, the first capacitor dielectric 102*d*, and the second electrode 102*e*. In some embodiments, the second isolation layer 102*f* entirely covers the first isolation layer 102*b*, the first electrode 102*c*, the first capacitor dielectric 102*d*, and the second electrode 102*e*. The second isolation layer 102*f* is disposed above the first recess 101*i*. In some embodiments, the second isolation layer 102*f* is disposed above the third recess 101*k*. In some embodiments, the second isolation layer 102*f* is at least partially disposed within the first recess 101*i*. In some embodiments, the second isolation layer 102*f* is at least partially disposed within the third recess 101*k*. In some embodiments, a portion of the second isolation layer 102*f* is surrounded by the second electrode 102*e*. In some embodiments, the second isolation layer 102*f* is conformal to the second electrode 102*e* and the first electrode 102*c*, so that a periphery portion of the second isolation layer 102*f* is in a stair shape.

The second isolation layer 102*f* includes dielectric material such as oxide or the like. In some embodiments, the second isolation layer 102*f* includes silicon dioxide or the like. In some embodiments, the second isolation layer 102*f* includes high-k (high dielectric constant) dielectric material, such as HfAlO, ZrO$_2$, aluminum oxide, titanium oxide, etc. In some embodiments, the second isolation layer 102*f* and the first isolation layer 102*b* include a same material. In some embodiments, an interface between the first isolation layer 102*b* and the second isolation layer 102*f* is absent.

In some embodiments, the semiconductor structure 100 includes a first dielectric layer 101*e* disposed over the substrate 101 and the first capacitor structure 102*a*. In some embodiments, the first dielectric layer 101*e* is disposed on the first surface 101*a* of the substrate 101 and the second isolation layer 102*f* of the first capacitor structure 102*a*. The first dielectric layer 101*e* includes dielectric material such as oxide or the like. In some embodiments, the second isolation layer 102*f* and the first dielectric layer 101*e* include a same material. In some embodiments, an interface between the second isolation layer 102*f* and the first dielectric layer 101*e* is absent.

In some embodiments, the semiconductor structure 100 includes a first passivation layer 101*f* disposed over the first dielectric layer 101*e*. The first passivation layer 101*f* includes dielectric material such as polymer, oxide, nitride or the like. In some embodiments, the semiconductor structure 100 includes a second dielectric layer 101*g* disposed over the first passivation layer 101*f*, and a second passivation layer 101*h* disposed over the second dielectric layer 101*g*. The second dielectric layer 101*g* is similar to the first dielectric layer 101*e*. The second passivation layer 101*h* is similar to the first passivation layer 101*f*. In some embodiments, the first dielectric layer 101*e*, the first passivation layer 101*f*, the second dielectric layer 101*g* and the second passivation layer 101*h* are sequentially stacked over the substrate 101. In some embodiments, several dielectric layers and several passivation layers are alternately disposed over the substrate 101.

The first interconnect structure 102*i* is disposed above the first capacitor structure 102*a*. The first interconnect structure 102*i* includes a first conductive via 102*j* and a first conductive member 102*k* coupled to the first conductive via 102*j*. The first conductive member 102*k* extends through and is surrounded by the second dielectric layer 101*g* and the first passivation layer 101*f*. The first conductive member 102*k* is disposed above the first conductive via 102*j*. The first conductive member 102*k* includes conductive material such as copper, silver or the like. The first conductive via 102*j* includes conductive material such as copper, silver or the like. In some embodiments, the first conductive via 102*j* and the first conductive member 102*k* include a same material.

The first conductive via 102*j* is disposed between the first conductive member 102*k* and the first surface 101*a* of the substrate 101. The first conductive via 102*j* is electrically coupled to the first conductive member 102*k*. In some embodiments, the first conductive via 102*j* extends through the second isolation layer 102*f* and the first dielectric layer 101*e*. The first conductive via 102*j* is at least partially surrounded by the second isolation layer 102*f*.

In some embodiments, the first conductive via 102*j* is electrically coupled to the first electrode 102*c*. In some embodiments, the first conductive via 102*j* is electrically coupled to the second electrode 102*e*. In some embodiments, the first conductive member 102*k* is electrically connected to the first electrode 102*c* via the first conductive via 102*j*. In some embodiments, the first conductive member 102*k* is electrically connected to the second electrode 102*e* via the first conductive via 102*j*. In some embodiments, the first conductive member 102*k* is electrically connected to both the first electrode 102*c* and the second electrode 102*f* via one or more the first conductive vias 102*j*. In some embodiments, the first conductive vias 102*j* have different lengths, that the first conductive via 102*j* contacting the first electrode 102*c* is longer than the first conductive via 102*j* contacting the second electrode 102*e*.

In some embodiments, the first interconnect structure 102*i* includes several conductive vias disposed above the first conductive member 102*k*, and several conductive members disposed above the conductive vias. The conductive vias and the conductive members above the first conductive member 102*k* are surrounded by the dielectric layers and the passivation layers stacked over the second passivation layer 101*h*. In some embodiments, the last conductive member 102*m* in the array region 101*c* is surrounded by the last dielectric layer 101*n* and is partially exposed through the last passivation layer 101*p* to electrically connect to an external conductive structure such as conductive bump or the like.

The seal ring 103 is disposed within the seal ring region 101d. In some embodiments, the seal ring 103 includes a second capacitor structure 103a and a second interconnect structure 103i disposed above the second capacitor structure 103a. The second capacitor structure 103a is at least partially disposed within the second recess 101j. In some embodiments, the second capacitor structure 103a is configured as a dummy capacitor. In some embodiments, the second capacitor structure 103a is electrically isolated from a circuitry in the substrate 101 and electrically isolated from the capacitor cells 102. The first capacitor structure 102a of the capacitor cell 102 is electrically isolated from the second capacitor structure 103a of the seal ring 103.

The second capacitor structure 103a includes a third isolation layer 103b, a third electrode 103c, a second capacitor dielectric 103d, a fourth electrode 103e, and a fourth isolation layer 103f. In some embodiments, the second capacitor structure 103a includes several third electrodes, several second capacitor dielectrics and several fourth electrodes alternately disposed. In some embodiments, several third electrodes, several second capacitor dielectrics, and several fourth electrodes are sequentially stacked between the third isolation layer 103b and the fourth isolation layer 103f. In some embodiments, a width of the second capacitor structure 103a is less than a width of the first capacitor structure 102a. In some embodiments, a ratio of the width of the second capacitor structure 103a to the width of the first capacitor structure 102a is about 0.1 to about 100. In some embodiments, the ratio is about 1 to about 20.

In some embodiments, the third isolation layer 103b is disposed over the first surface 101a of the substrate 101 and conformal to the second recess 101j. In some embodiments, the third isolation layer 103b is also disposed conformal to the second recess 101j. The third isolation layer 103b includes dielectric material such as oxide or the like. In some embodiments, the third isolation layer 103b includes silicon dioxide or the like. In some embodiments, the third isolation layer 103b includes high-k (high dielectric constant) dielectric material, such as hafnium aluminate oxide (HfAlO), zirconium oxide ($ZrO_2$), aluminum oxide, titanium oxide, etc. In some embodiments, the third isolation layer 103b is similar to the first isolation layer 102b.

The third electrode 103c is disposed over and conformal to the third isolation layer 103b. The third electrode 103c is disposed over the first surface 101a of the substrate 101 and is at least partially disposed within the second recess 101j. The third electrode 103c includes conductive material such as copper, titanium nitride (TiN), polysilicon or the like. In some embodiments, a portion of the third isolation layer 103b is exposed through the third electrode 103c. In some embodiments, the third electrode 103c is a bottom electrode of the second capacitor structure 103a. In some embodiments, the third electrode 103c is similar to the first electrode 102c.

The second capacitor dielectric 103d is disposed over and conformal to the third electrode 103c. The second capacitor dielectric 103d is disposed over the first surface 101a of the substrate 101 and is at least partially disposed within the second recess 101j. The second capacitor dielectric 103d includes dielectric material such as nitride, oxide or the like. In some embodiments, the second capacitor dielectric 103d includes high-dielectric material, such as HfAlO, $ZrO_2$, aluminum oxide, titanium oxide, etc. In some embodiments, a portion of the third electrode 103c is exposed through second capacitor dielectric 103d. In some embodiments, the second capacitor dielectric 103d is similar to the first capacitor dielectric 102d.

The fourth electrode 103e is disposed over and conformal to the second capacitor dielectric 103d. The fourth electrode 103e is disposed over the first surface 101a of the substrate 101 and is at least partially disposed within the second recess 101j. The fourth electrode 103e includes conductive material such as copper, titanium nitride (TiN), polysilicon or the like. In some embodiments, the second capacitor dielectric 103d is entirely covered by the fourth electrode 103e. In some embodiments, a portion of the third isolation layer 103b and a portion of the third electrode 103c are exposed through the fourth electrode 103e. In some embodiments, a portion of the third isolation layer 103b and a portion of the third electrode 103c are exposed through the second capacitor dielectric 103d. In some embodiments, the fourth electrode 103e is a top electrode of the second capacitor structure 103a.

The fourth isolation layer 103f is disposed over the third isolation layer 103b, the third electrode 103c, the second capacitor dielectric 103d, and the fourth electrode 103e. In some embodiments, the fourth isolation layer 103f entirely covers the third electrode 103c, the second capacitor dielectric 103d, and the fourth electrode 103e. The fourth isolation layer 103f is disposed above the second recess 101j. In some embodiments, the fourth isolation layer 103f is at least partially disposed within the second recess 101j. In some embodiments, a portion of the fourth isolation layer 103f is surrounded by the fourth electrode 103e. In some embodiments, the fourth isolation layer 103f is conformal to the fourth electrode 103e and the second electrode 103c, so that a periphery portion of the fourth isolation layer 103f is in a step shape.

The fourth isolation layer 103f includes dielectric material such as oxide or the like. In some embodiments, the fourth isolation layer 103f includes silicon dioxide or the like. In some embodiments, the fourth isolation layer 103f includes high-k (high dielectric constant) dielectric material, such as HfAlO, $ZrO_2$, aluminum oxide, titanium oxide, etc. In some embodiments, the fourth isolation layer 103f and the third isolation layer 103b include a same material. In some embodiments, an interface between the third isolation layer 103b and the fourth isolation layer 103f is absent. The first dielectric layer 101e surrounds the fourth isolation layer 103f. In some embodiments, an interface between fourth isolation layer 103f and the first dielectric layer 101e is absent.

The second interconnect structure 103i is disposed above the second capacitor structure 103a. The second interconnect structure 103i includes a second conductive via 103j and a second conductive member 103k coupled to the second conductive via 103j. The second conductive member 103k extends through and is surrounded by the second dielectric layer 101g and the first passivation layer 101f. The second conductive member 103k is disposed above the second conductive via 103j. The second conductive member 103k includes conductive material such as copper, silver or the like. The second conductive via 103j includes conductive material such as copper, silver or the like. In some embodiments, the second conductive via 103j and the second conductive member 103k include a same material. In some embodiments, the second interconnect structure 103i is configured as a dummy structure, that electrically isolated from a circuitry in the substrate 101 and electrically isolated from the capacitor cells 102.

The second conductive via 103j is disposed between the second conductive member 103k and the first surface 101a of the substrate 101. The second conductive via 103j is electrically coupled to the second conductive member 103k.

In some embodiments, the second conductive via 103*j* extends through the fourth isolation layer 103*f* and the first dielectric layer 101*e*. The second conductive via 103*j* is at least partially surrounded by the fourth isolation layer 103*f*. The second conductive via 103*j* extends through the fourth isolation layer 103*f* and contacts the third electrode 103*c* of the second capacitor structure 103*a*.

In some embodiments, the second conductive via 103*j* is electrically coupled to the third electrode 103*c*. In some embodiments, the second conductive via 103*j* is electrically coupled to the fourth electrode 103*e*. In some embodiments, the second conductive member 103*k* is electrically connected to the third electrode 103*c* via the second conductive via 103*j*. In some embodiments, the second conductive member 103*k* is electrically connected to the fourth electrode 103*e* via the second conductive via 103*j*. In some embodiments, the second conductive member 103*k* is electrically connected to both the third electrode 103*c* and the fourth electrode 103*f* via one or more the second conductive vias 103*j*. In some embodiments, the second conductive vias 103*j* have different lengths, that the second conductive via 103*j* contacting the third electrode 103*c* is longer than the second conductive via 103*j* contacting the fourth electrode 103*e*.

The second interconnect structure 103*i* further includes a third conductive via 103*m* disposed between the second conductive member 103*k* and the first surface 101*a* of the substrate 101. The second conductive member 103*k* is disposed above the third conductive via 103*m*. The third conductive via 103*m* includes conductive material such as copper, silver or the like. In some embodiments, the third conductive via 103*m* and the second conductive via 103*j* include a same material. The third conductive via 103*m* is electrically coupled to the second conductive member 103*k*. In some embodiments, the third conductive via 103*m* extends through the first dielectric layer 101*e*. The third conductive via 103*m* is spaced apart from the fourth isolation layer 103*f* of the second capacitor structure 103*a*.

In some embodiments, the second interconnect structure 103*i* is electrically coupled to the substrate 101. The third conductive via 103*m* of the second interconnect structure 103*i* is electrically coupled to the substrate 101. Such connection can avoid charging effect of the semiconductor structure 100 such as arcing or the like. In some embodiments, the third conductive via 103*m* is in contact with the first surface 101*a* of the substrate 101. In some embodiments, the second interconnect structure 103*i* is connected to electrical ground. In some embodiments, the third conductive via 103*a* is connected to electrical ground.

The third conductive via 103*m* is electrically isolated from the third electrode 103*c* and the fourth electrode 103*e*. In some embodiments, the second conductive via 103*j* contacting the third electrode 103*c* is shorter than the third conductive via 103*m* contacting the substrate 101. In some embodiments, the second conductive via 103*j* contacting the fourth electrode 103*e* is shorter than the third conductive via 103*m* contacting the substrate 101.

In some embodiments, the second interconnect structure 103*i* includes several conductive vias disposed above the second conductive member 103*k*, and several conductive members disposed above the conductive vias. The conductive vias and the conductive members above the second conductive member 103*k* are surrounded by the dielectric layers and the passivation layers stacked over the second passivation layer 101*h*. In some embodiments, the last conductive member 103*n* in the seal ring region 101*d* is surrounded by the last dielectric layer 101*n* and is covered by the last passivation layer 101*p*.

Figure 3:
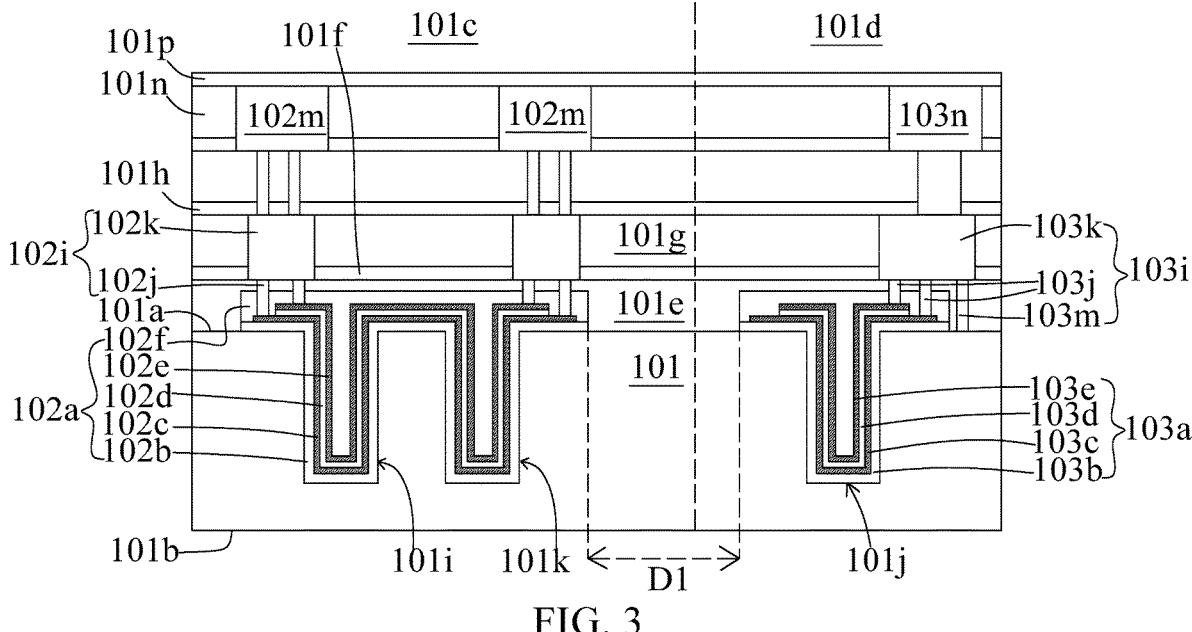
FIG. 3 is a cross-sectional view of another embodiment of the semiconductor structure along a line A-A of FIG. 1.

FIG. 3 is a schematic cross-sectional view of another embodiment of the semiconductor structure 100. The semiconductor structure 100 illustrated in FIG. 3 is similar to the semiconductor structure 100 illustrated in FIG. 2, except the semiconductor structure 100 of FIG. 3 has several second conductive vias 103*j* coupled to the third electrode 103*c* or the fourth electrode 103*e*. In some embodiments all of the second conductive vias 103*j* are coupled to the third electrode 103*c* or the fourth electrode 103*e*.

Figure 4:
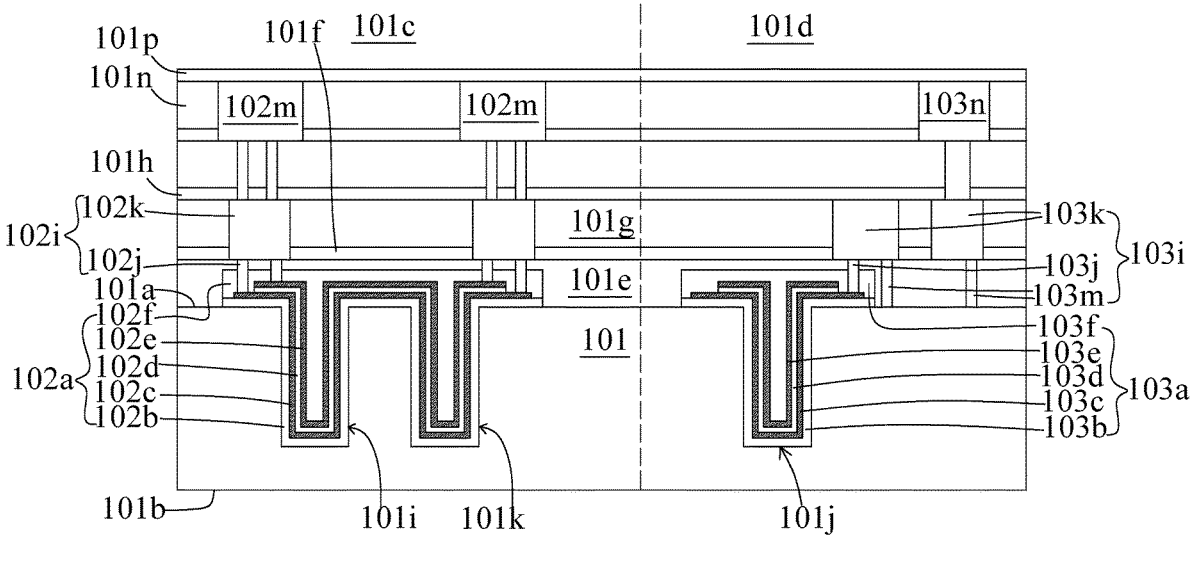
FIG. 4 is a cross-sectional view of another embodiment of the semiconductor structure along a line A-A of FIG. 1.

FIG. 4 is a schematic cross-sectional view of another embodiment of the semiconductor structure 100. The semiconductor structure 100 illustrated in FIG. 4 is similar to the semiconductor structure 100 illustrated in FIG. 3, except the semiconductor structure 100 of FIG. 4 includes several second conductive members 103*k*. In some embodiments, the second conductive member 103*k* coupled with the second conductive via 103*j* is separated from the second conductive member 103*k* coupled with the third conductive via 103*m*.

In some embodiments, the second conductive member 103*k* coupled with the second conductive via 103*j* and the third conductive via 103*k* is separated from the second conductive member 103*k* coupled only with the third conductive via 103*m*. In some embodiments, the second conductive member 103*k* coupled with the second conductive via 103*j* is electrically isolated from the last conductive via 103*n*. In some embodiments, the second conductive member 103*k* coupled only with the third conductive via 103*m* is electrically connected to the last conductive via 103*n*.

Figure 5:
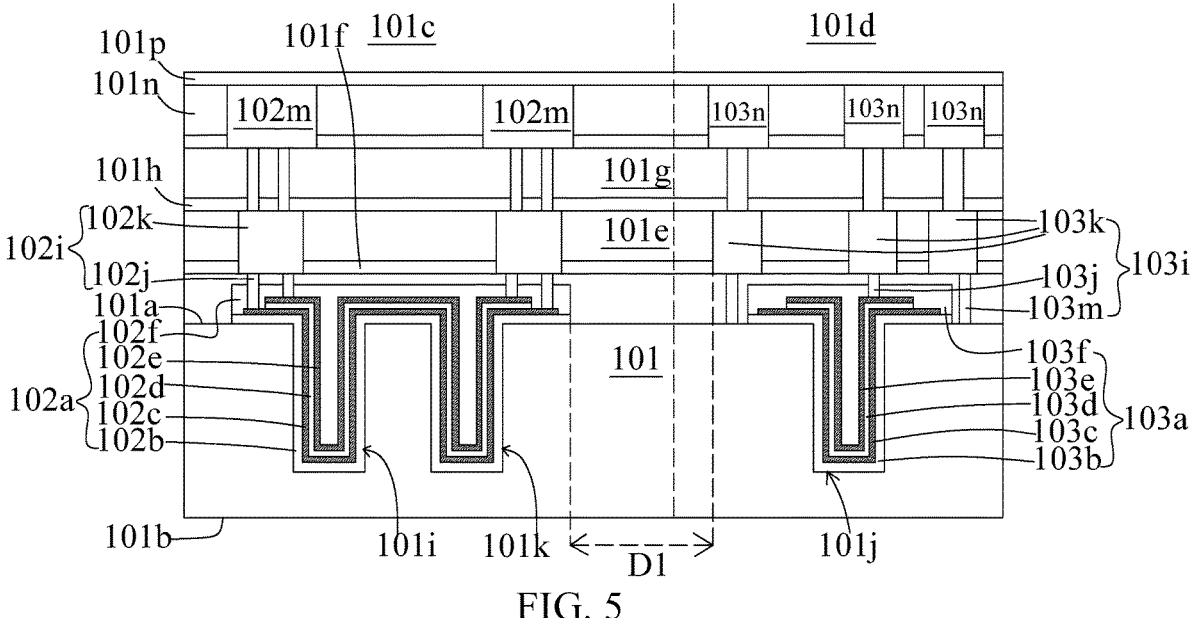
FIG. 5 is a cross-sectional view of another embodiment of the semiconductor structure along a line A-A of FIG. 1.

FIG. 5 is a schematic cross-sectional view of another embodiment of the semiconductor structure 100. The semiconductor structure 100 illustrated in FIG. 5 is similar to the semiconductor structure 100 illustrated in FIG. 4, except more than one second conductive member 103*k* is coupled to the substrate 101 as shown in FIG. 5. In some embodiments, the third conductive via 103*m* is disposed between the first capacitor structure 102*a* and the second capacitor structure 103*a*. In some embodiments, the second conductive member 103*k* coupled with the second conductive via 103*j* is separated from the second conductive member 103*k* coupled with the third conductive via 103*m*.

Figure 6:
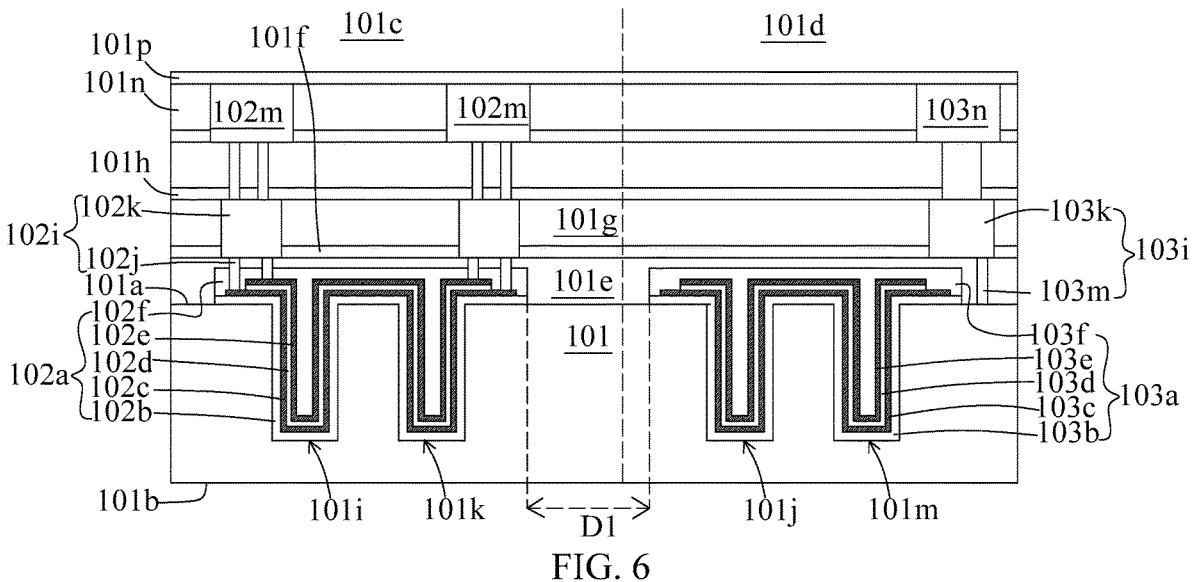
FIG. 6 is a cross-sectional view of another embodiment of the semiconductor structure along a line A-A of FIG. 1.

FIG. 6 is a schematic cross-sectional view of another embodiment of the semiconductor structure 100. The semiconductor structure 100 illustrated in FIG. 6 is similar to the semiconductor structure 100 illustrated in FIG. 2, except the substrate 101 of the semiconductor structure 100 in FIG. 6 further includes a fourth recess 101*m* extending into the substrate 101 and disposed within the seal ring region 101*d*. In some embodiments, the second capacitor structure 103*a* is also at least partially disposed within the fourth recess 101*m*. In some embodiments, a width of the second capacitor structure 103*a* is substantially equal to a width of the first capacitor structure 102*a*.

Figure 7:
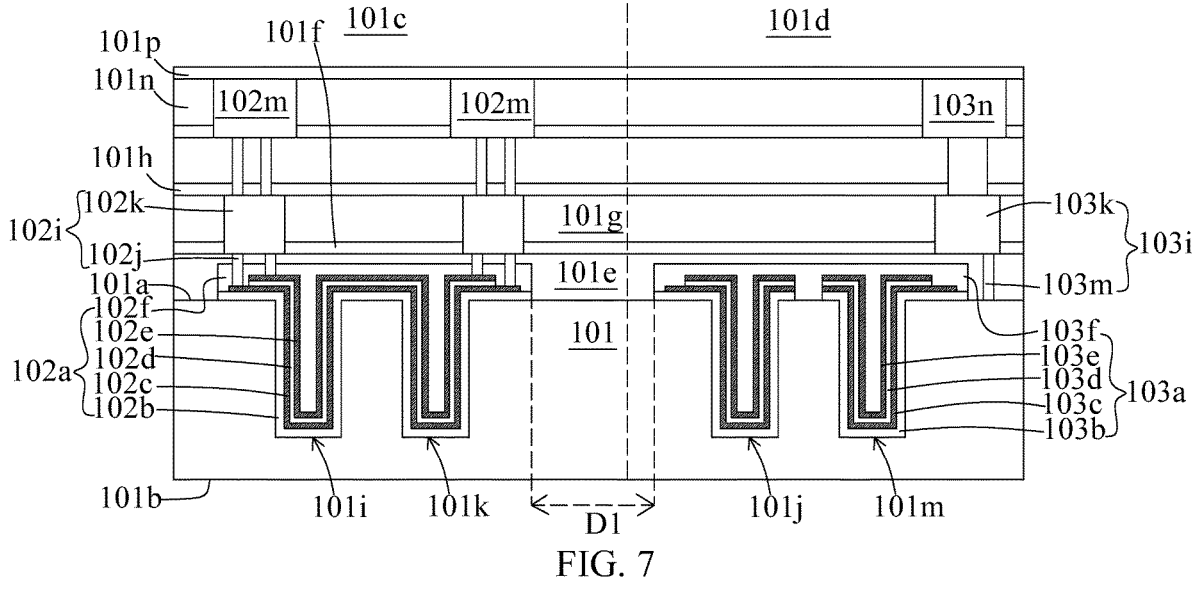
FIG. 7 is a cross-sectional view of another embodiment of the semiconductor structure along a line A-A of FIG. 1.

FIG. 7 is a schematic cross-sectional view of another embodiment of the semiconductor structure 100. The semiconductor structure 100 illustrated in FIG. 7 is similar to the semiconductor structure 100 illustrated in FIG. 6, except the second capacitor structure 103*a* in FIG. 7 is divided into two portions separated from each other. In some embodiments, each portion includes the third isolation layer 103*b*, the third electrode 103*c*, the second capacitor dielectric 103*d*, and the fourth electrode 103*e*. In some embodiments, the two portions are separated by the fourth isolation layer 103*f*. In some embodiments, the two portions are covered by the fourth isolation layer 103*f*. In some embodiments, the two portions are at least partially disposed within the second recess 101*j* and the fourth recess 101*m* respectively.

In the present disclosure, a method of manufacturing the semiconductor structure 100 is also disclosed. In some embodiments, the semiconductor structure 100 is fabricated by a method 200. The method 200 includes a number of operations and the description and illustration are not deemed as a limitation as the sequence of the operations. FIG. 8 is an embodiment of the method 200 of manufacturing the semiconductor structure 100. The method 200 includes a number of operations (201, 202, 203, 204, 205 and 206).

Figure 9:
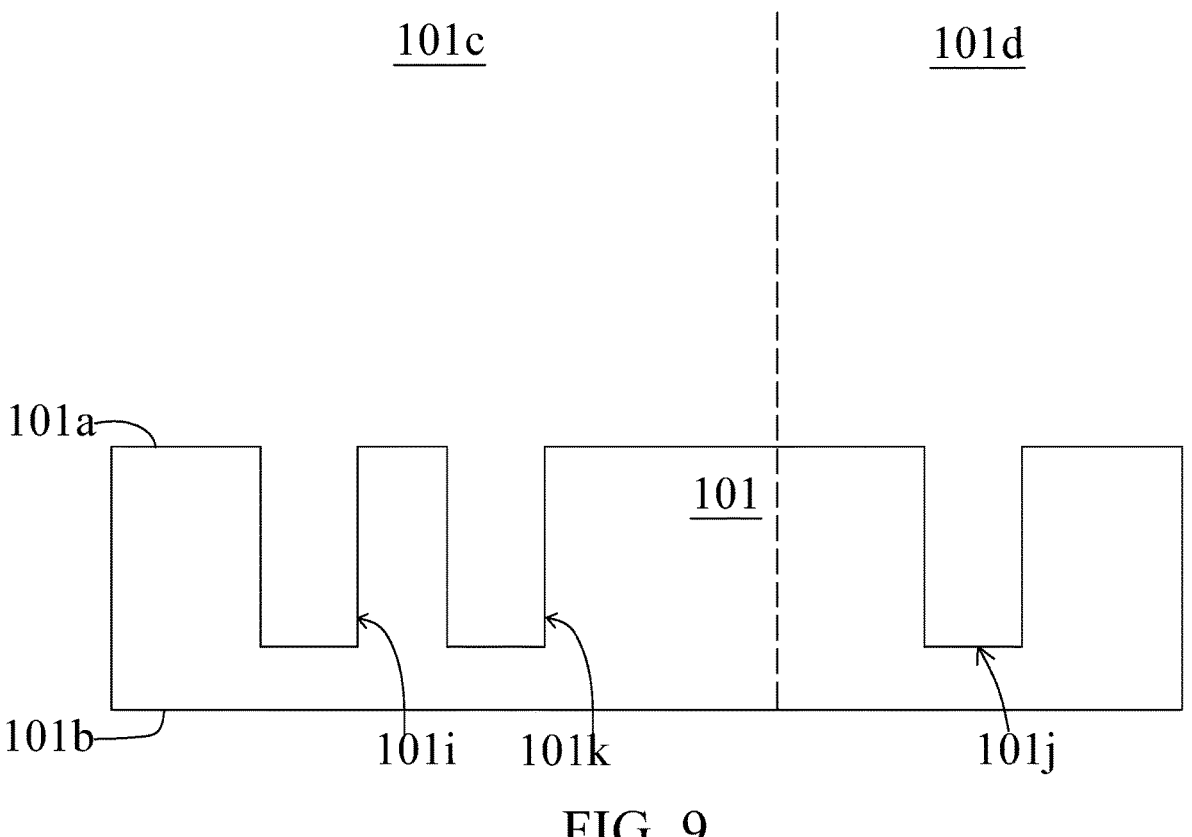
FIGS. 9 to 15 are cross-sectional views of one or more stages of the method of manufacturing a semiconductor structure in accordance with some embodiments of the present disclosure.

In operation 201, a substrate 101 is provided as shown in FIG. 9. The substrate 101 defines with an array region 101*c* and a seal ring region 101*d* surrounding the array region 101*c*. In operation 202, a first recess 101*i* and a second recess 101*j* are formed as shown in FIG. 9. In some embodiments, a third recess 101*k* is also formed. The first recess 101*i*, the second recess 101*j*, and the third recess 101*k* respectively extend into the substrate 101. The first recess 101*i* and the third recess 101*k* are formed within the array region 101, and the second recess 101*j* is formed within the seal ring region 101*d*. In some embodiments, the first recess 101*i*, the second recess 101*j*, and the third recess 101*k* are formed by etching or any other suitable operations.

Figure 10:
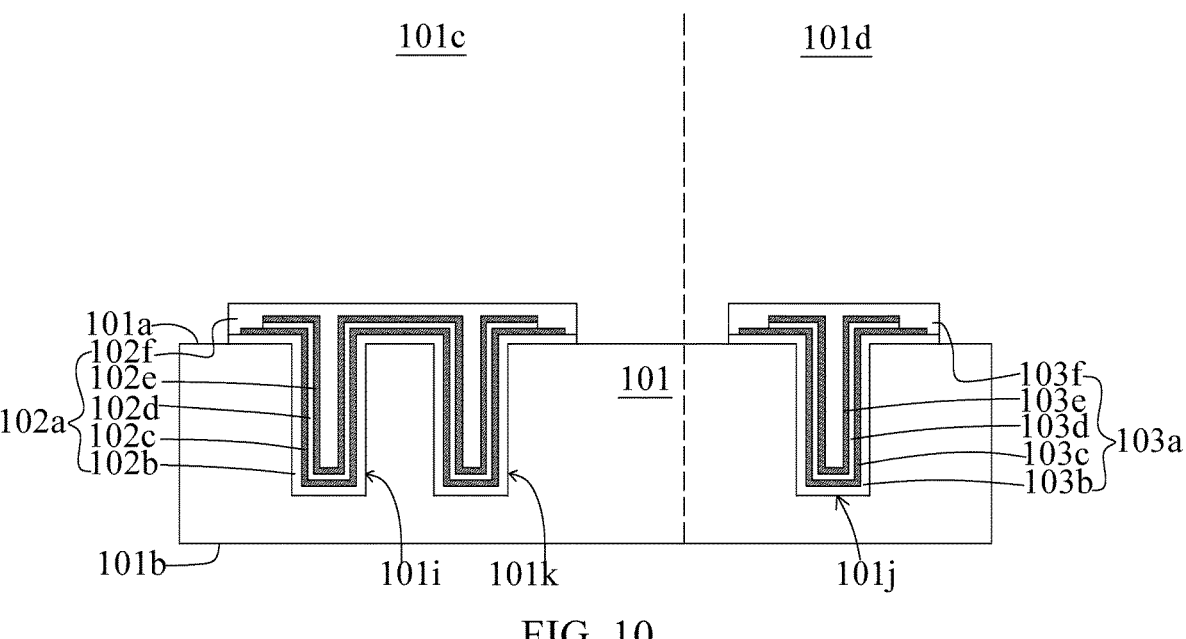

In operation 203, a first capacitor structure 102*a* and a second capacitor structure 103*a* are formed over the substrate 101 as shown in FIG. 10. In some embodiments, the first capacitor structure 102*a* and the second capacitor structure 103*a* are formed simultaneously or separately. The first capacitor structure 102*a* is formed at least partially within the first recess 101*i* and the third recess 101*k*. In some embodiments, the first capacitor structure 102*a* is formed by sequentially disposing a first isolation layer 102*b*, a first electrode 102*c*, a first capacitor dielectric 102*d*, a second electrode 102*e*, and a second isolation layer 102*f*. The second capacitor structure 103*a* is formed at least partially within the second recess 101*j*. In some embodiments, the second capacitor structure 103*a* is formed by sequentially disposing a third isolation layer 103*b*, a third electrode 103*c*, a second capacitor dielectric 103*d*, a fourth electrode 103*e*, and a fourth isolation layer 103*f*.

Figure 11:
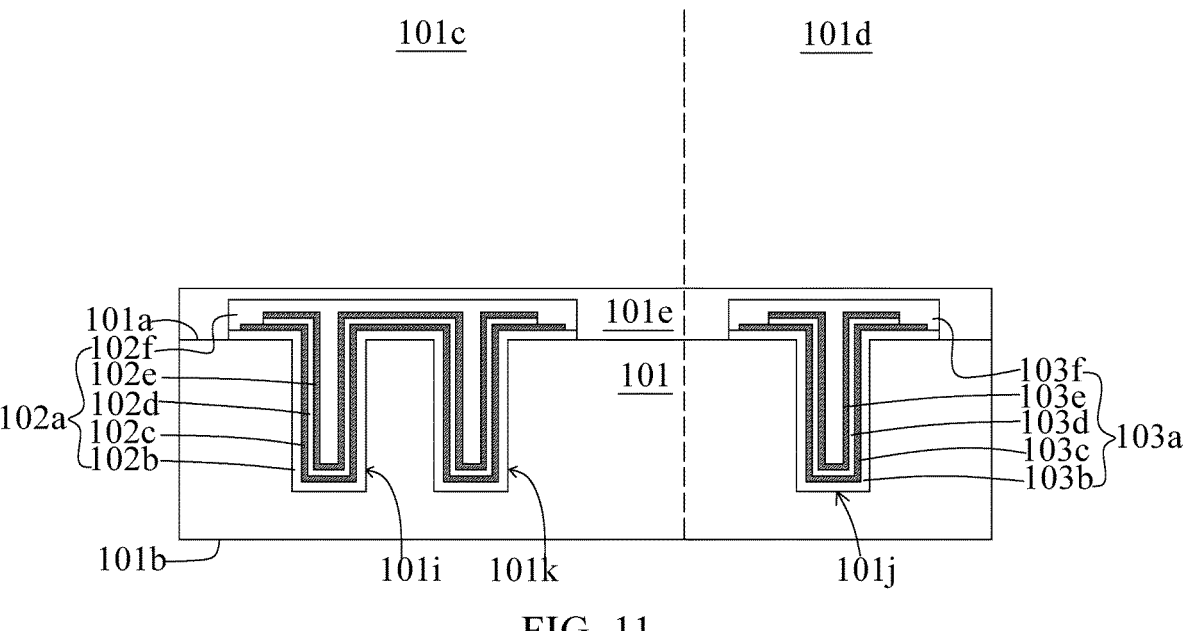

In operation 204, a first dielectric layer 101*e* is disposed over the substrate 101, the first capacitor structure 102*a*, and the second capacitor structure 103*a* as shown in FIG. 11. The first dielectric layer 101*e* is disposed over the first surface 101*a* of the substrate 101, the second isolation layer 102*f*, and the fourth isolation layer 103*f*. In some embodiments, the first dielectric layer 101*e* is disposed by deposition, chemical vapor deposition (CVD) or any other suitable operations.

Figure 12:
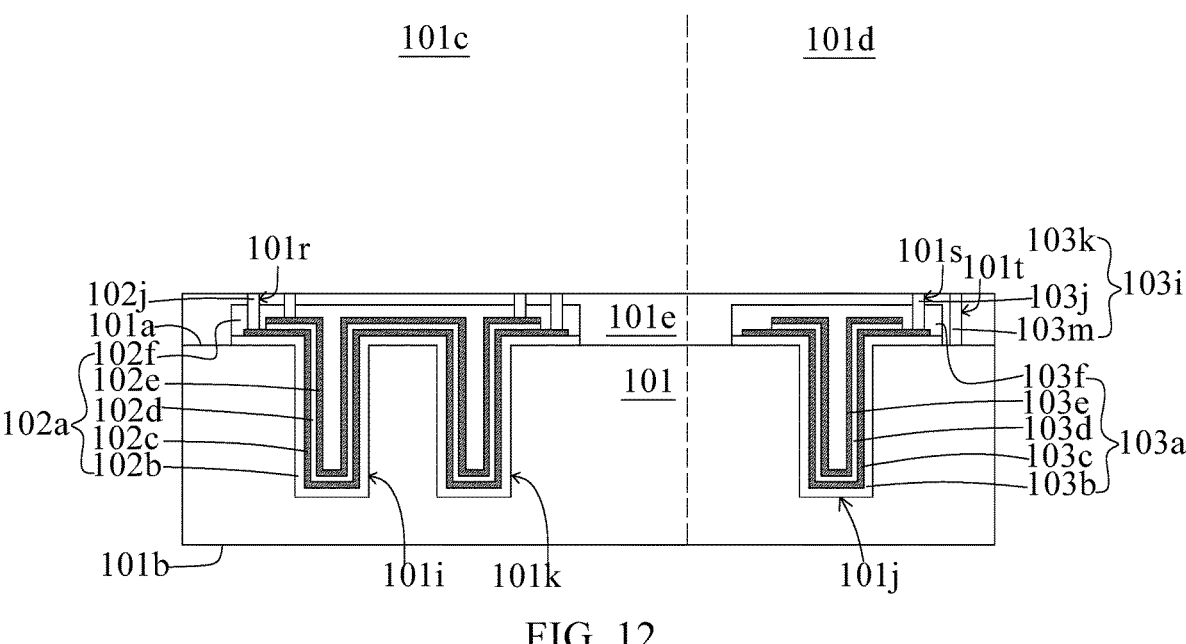

In operation 205, portions of the first dielectric layer 101*e* are removed to form several openings extending through the first dielectric layer 101*e* as shown in FIG. 12. In some embodiments, a first opening 101*r*, a second opening 101*s*, and a third opening 101*t* are formed after the removal of the portions of the first dielectric layer 101*e*. In some embodiments, the first opening 101*r* extends through the second isolation layer 102*f*, the second opening 101*s* extends through the fourth isolation layer 103*f*, and the third opening 101*t* extends through the first dielectric layer 101*e*. The first opening 101*r* is disposed within the array region 101*c*. The second opening 101*s* and the third opening 101*t* are disposed within the seal ring region 101*d*.

In some embodiments, the first opening 101*r* is formed above the first electrode 102*c* exposed through the second isolation layer 102*f*. In some embodiments, the first opening 101*r* is formed above the second electrode 102*e* exposed through the second isolation layer 102*f*. In some embodiments, the second opening 101*s* is formed above the third electrode 103*c* exposed through the fourth isolation layer 102*f*. In some embodiments, the third opening 101*t* is formed above the first surface 101*a* of the substrate 101 exposed through the fourth isolation layer 102*f*. The third opening 101*t* is separated from the second opening 101*s* by the fourth isolation layer 103*f* and the first dielectric layer 101*e*.

In operation 206, several conductive vias are formed within the openings respectively as shown in FIG. 12. In some embodiments, a first conductive via 102*j*, a second conductive via 103*j*, and a third conductive via 103*m* are formed within the first opening 101*r*, the second opening 101*s*, and the third opening 101*t* respectively. In some embodiments, the first conductive via 102*j*, the second conductive via 103*j*, and the third conductive via 103*m* are formed by electroplating, sputtering or any other suitable operations. The first conductive via 102*j* is in contact with the first electrode 102*c* or the second electrode 102*e*. The second conductive via 103*j* is in contact with the third electrode 103*c* or the fourth electrode 103*e*. The third conductive via 103*m* is in contact with the substrate 101.

Figure 13:
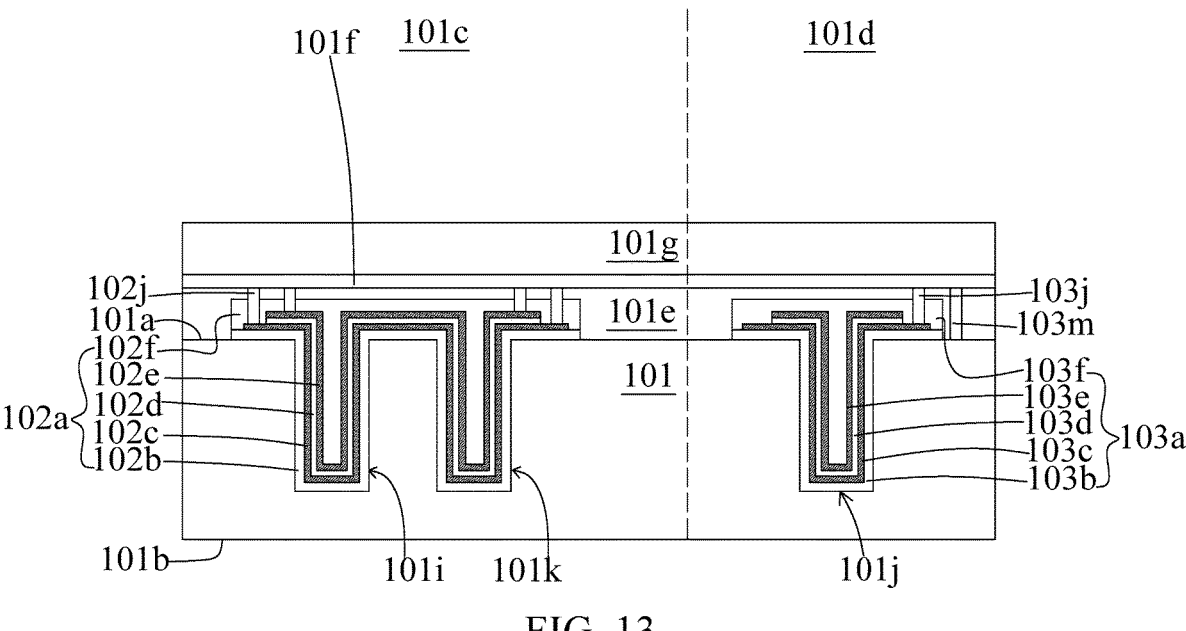
Figure 14:
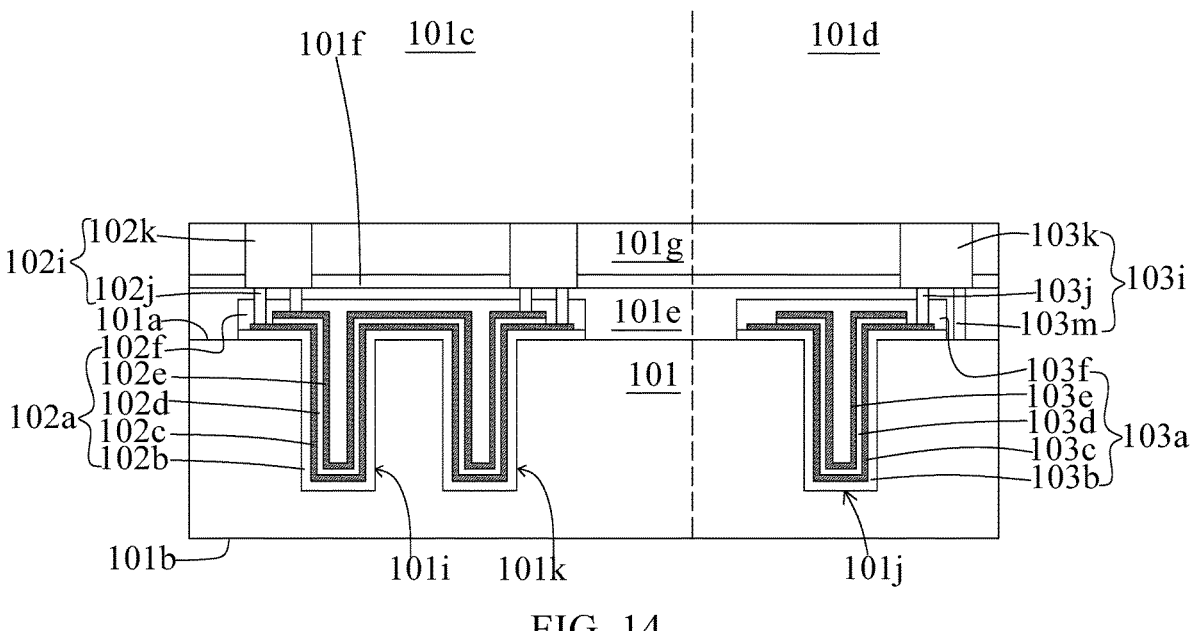

After the formation of the conductive vias, a first passivation layer 101*f* and a second dielectric layer 101*g* are sequentially disposed as shown in FIG. 13. The first passivation layer 101*f* covers the conductive vias and the first dielectric layer 101*e*. After the disposing of the first passivation layer 101*f* and the second dielectric layer 101*g*, portions of the first passivation layer 101*f* and the second dielectric layer 101*g* are removed as shown in FIG. 14, whereby the conductive vias are exposed through the first passivation layer 101*f* and the second dielectric layer 101*g*. Subsequently, a first conductive member 102*k* and a second conductive member 103*k* are formed and surrounded by the first passivation layer 101*f* and the second dielectric layer 101*g* as shown in FIG. 14. The first conductive member 102*k* is in contact with the first conductive via 102*j*. The second conductive member 103*k* is in contact with the second conductive via 103*j* and the third conductive via 103*m*. In some embodiments, the second conductive member 103*k* is connected to the substrate 101 through the third conductive via 103*m*. In some embodiments, the second conductive member 103*k* is connected to an electrical ground through the third conductive via 103*m*.

Figure 15:
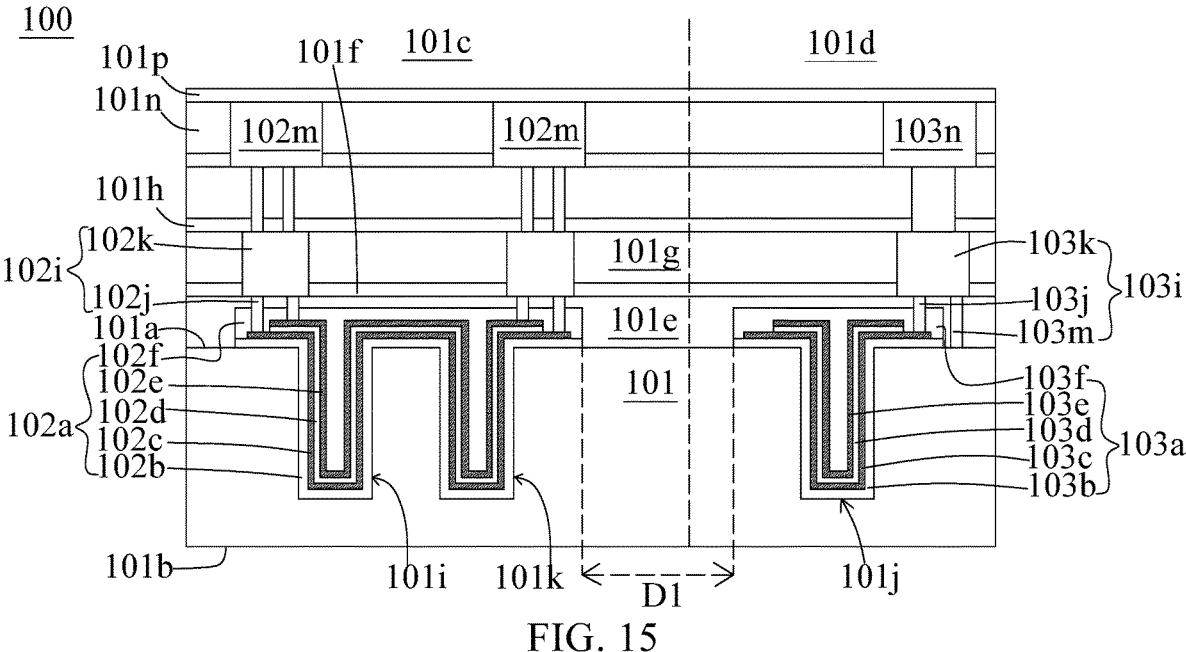

After the formation of the first conductive member 102*k* and the second conductive member 103*k*, a second passivation layer 101*h* is disposed over the first conductive member 102*k*, the second conductive member 103*k*, and the second dielectric layer 101*g*. In some embodiments, several dielectric layers and several passivation layers are alternately and sequentially disposed as shown in FIG. 15. In some embodiments, several conductive vias and several conductive members are sequentially formed within the dielectric layers and the passivation layers as shown in FIG. 15. In some embodiments, the semiconductor structure 100 is formed as shown in FIG. 15.

One aspect of this disclosure relates to a semiconductor structure. The semiconductor structure includes a substrate defined with an array region and a seal ring region surrounding the array region, and including a recess extending into the substrate; a capacitor cell disposed within the array region; and a seal ring disposed within the seal ring region, and including a capacitor structure at least partially disposed within the recess, and an interconnect structure disposed over the capacitor structure, wherein the interconnect structure is electrically coupled to the substrate.

In some embodiments, the interconnect structure is connected to an electrical ground. In some embodiments, the capacitor structure of the seal ring is a dummy capacitor. In some embodiments, the capacitor structure of the seal ring is electrically isolated from the capacitor cell. In some embodiments, the capacitor structure includes an electrode at least partially disposed within the recess and over the substrate. In some embodiments, the interconnect structure is electrically coupled to the electrode of the capacitor structure.

In some embodiments, the capacitor structure includes an isolation layer covering the electrode. In some embodiments, the interconnect structure includes a conductive via extending through the isolation layer and contacting the electrode of the capacitor structure. In some embodiments, the semiconductor structure further includes a dielectric layer disposed over the substrate and the capacitor structure, wherein the interconnect structure includes a conductive via extending through the dielectric layer and contacting the substrate. In some embodiments, a distance between the capacitor cell and the seal ring is substantially greater than 0.1 um.

One aspect of this disclosure relates to a semiconductor structure. The semiconductor structure includes a substrate defined with an array region and a seal ring region surrounding the array region, and including a first recess and a second recess respectively extending into the substrate; a capacitor cell disposed within the array region, and including a first capacitor structure at least partially disposed within the first recess, and a first interconnect structure disposed over the first capacitor structure; and a seal ring disposed within the seal ring region, and including a second capacitor structure at least partially disposed within the second recess, and a second interconnect structure disposed over the second capacitor structure, wherein the second interconnect structure is coupled to the substrate.

In some embodiments, the first capacitor structure of the capacitor cell is electrically isolated from the second capacitor structure of the seal ring. In some embodiments, the first capacitor structure includes a first electrode at least partially disposed within the first recess and over the substrate, the second capacitor structure includes a second electrode at least partially disposed within the second recess and over the substrate. In some embodiments, the first interconnect structure includes a first conductive via coupled to the first electrode, the second interconnect structure includes a second conductive via coupled to the second electrode.

In some embodiments, the second interconnect structure includes a third conductive via coupled to the substrate. In some embodiments, a length of the second conductive via is substantially shorter than a length of the third conductive via. In some embodiments, the semiconductor structure further includes a dielectric layer disposed over the substrate, the first capacitor structure, and the second capacitor structure, wherein the first conductive via, the second conductive via and the third conductive via are surrounded by the dielectric layer. In some embodiments, a depth of the first recess is substantially equal to a depth of the second recess.

An aspect of this disclosure relates to a method of manufacturing a semiconductor structure. The method includes providing a substrate defined with an array region and a seal ring region surrounding the array region; forming a recess within the seal ring region and extending into the substrate; forming a capacitor structure at least partially disposed within the recess and over the substrate; disposing a dielectric layer over the substrate and the capacitor structure; removing a portion of the dielectric layer to form an opening extending through the dielectric layer; and forming a conductive via within the opening and contacting the substrate.

In some embodiments, the opening is isolated from the capacitor structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate defined with an array region and a seal ring region surrounding the array region, and including a first surface, a second surface opposite to the first surface, and a recess extending from the first surface toward the second surface;
a capacitor cell disposed within the array region; and
a seal ring disposed within the seal ring region, and including a capacitor structure at least partially disposed within the recess and at least partially disposed on the first surface, and an interconnect structure disposed over the capacitor structure,
wherein the interconnect structure is electrically coupled to first surface of the substrate.

2. The semiconductor structure of claim 1, wherein the interconnect structure is connected to an electrical ground.

3. The semiconductor structure of claim 1, wherein the capacitor structure of the seal ring is a dummy capacitor.

4. The semiconductor structure of claim 1, wherein the capacitor structure of the seal ring is electrically isolated from the capacitor cell.

5. The semiconductor structure of claim 1, wherein the capacitor structure includes an electrode at least partially disposed within the recess and over the substrate.

6. The semiconductor structure of claim 5, wherein the interconnect structure is electrically coupled to the electrode of the capacitor structure.

7. The semiconductor structure of claim 5, wherein the capacitor structure includes an isolation layer covering the electrode.

8. The semiconductor structure of claim 7, wherein the interconnect structure includes a conductive via extending through the isolation layer and contacting the electrode of the capacitor structure.

9. The semiconductor structure of claim 1, further comprising a dielectric layer disposed over the substrate and the capacitor structure, wherein the interconnect structure includes a conductive via extending through the dielectric layer and contacting the substrate.

10. The semiconductor structure of claim 1, wherein a distance between the capacitor cell and the seal ring is substantially greater than 0.1 um.

11. A semiconductor structure, comprising:
a substrate defined with an array region and a seal ring region surrounding the array region, and including a first surface, a second surface opposite to the first surface, and a recess extending into the substrate;

a capacitor cell disposed within the array region and partially surrounded by the substrate; and a seal ring disposed within the seal ring region, and including a capacitor structure at least partially disposed within the recess and at least partially disposed on the first surface, and an interconnect structure disposed over the capacitor structure; and a dielectric layer on the first surface of the substrate and covering the capacitor structure, wherein the interconnect structure extends through the dielectric layer and is coupled to the first surface of the substrate.

12. The semiconductor structure of claim 11, wherein the capacitor cell is electrically isolated from the capacitor structure of the seal ring.

13. The semiconductor structure of claim 11, wherein the capacitor structure includes an electrode at least partially disposed within the recess and over the substrate.

14. The semiconductor structure of claim 13, wherein the interconnect structure includes a first conductive via coupled to the electrode.

15. The semiconductor structure of claim 14, wherein the interconnect structure includes a second conductive via coupled to the substrate.

16. The semiconductor structure of claim 15, wherein a length of the first conductive via is substantially shorter than a length of the second conductive via.

17. The semiconductor structure of claim 15, wherein the dielectric layer is disposed over the capacitor cell and the first conductive via and the second conductive via are surrounded by the dielectric layer.

18. The semiconductor structure of claim 11, wherein a depth of a portion of the capacitor cell laterally surrounded by the substrate is substantially equal to a depth of the recess.

19. A semiconductor structure, comprising:

a substrate defined with an array region and a seal ring region surrounding the array region, and including a first surface, a second surface opposite to the first surface, and a recess within the seal ring region and extending into the substrate;

a capacitor structure at least partially disposed within the recess and at least partially disposed on the first surface;

a dielectric layer over the substrate and the capacitor structure; and a conductive via extending through the dielectric layer and contacting the first surface of the substrate.

20. The semiconductor structure of claim 19, wherein the conductive via is isolated from the capacitor structure.

* * * * *